(12) United States Patent
Heitstuman et al.

(10) Patent No.: US 10,965,079 B2
(45) Date of Patent: Mar. 30, 2021

(54) COMB PATTERN INSERT FOR WAVE SOLDER PALLETS

(71) Applicant: Schweitzer Engineering Laboratories, Inc., Pullman, WA (US)

(72) Inventors: Tiffani T. Heitstuman, Garfield, WA (US); Jeff Bredeson, Moscow, ID (US); Greg Simpson, Spangle, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 420 days.

(21) Appl. No.: 16/172,398

(22) Filed: Oct. 26, 2018

(65) Prior Publication Data
US 2020/0136330 A1    Apr. 30, 2020

(51) Int. Cl.
*B23K 3/00*    (2006.01)
*H01R 43/02*    (2006.01)
*B23K 3/08*    (2006.01)
*H05K 1/11*    (2006.01)

(52) U.S. Cl.
CPC ......... *H01R 43/0256* (2013.01); *B23K 3/087* (2013.01); *H05K 1/116* (2013.01)

(58) Field of Classification Search
CPC ............... H05K 3/3468; H05K 3/3447; H05K 2203/0173; H05K 1/116; H05K 3/3452; B23K 3/087; B23K 1/085; B23K 3/0646
See application file for complete search history.

(56) References Cited

U.S. PATENT DOCUMENTS

| | | | | | |
|---|---|---|---|---|---|
| 2,964,007 | A | * | 12/1960 | Buffington | B23K 3/0669 228/12 |
| 4,506,820 | A | * | 3/1985 | Brucker | B23K 3/0646 118/406 |
| 5,454,505 | A | * | 10/1995 | Kearns | B23K 3/087 118/406 |
| 6,202,916 | B1 | * | 3/2001 | Updike | B23K 1/085 228/180.1 |
| 2002/0038815 | A1 | * | 4/2002 | Yamaguchi | H05K 3/3468 228/260 |
| 2006/0102703 | A1 | * | 5/2006 | Akhtar | B23K 37/0408 228/260 |
| 2008/0307643 | A1 | * | 12/2008 | Sozansky | H01L 23/42 29/839 |
| 2009/0101397 | A1 | * | 4/2009 | Kuo | H05K 3/3468 174/260 |
| 2010/0236823 | A1 | * | 9/2010 | Hu | H05K 1/116 174/262 |
| 2012/0039010 | A1 | * | 2/2012 | Tresness | H05K 1/026 361/112 |

* cited by examiner

*Primary Examiner* — Erin B Saad
(74) *Attorney, Agent, or Firm* — Justin K. Flanagan

(57) ABSTRACT

Systems and methods are disclosed herein relating to eliminating solder bridges between adjacent leads of small-pitch through-hole electrical components soldered to circuit boards using wave-soldering techniques. Several wave solder pallet insert patterns are disclosed. Each wave solder insert may include an insert pattern of peeling members is intended to eliminate solder bridges from various small-pitch component lead layouts.

26 Claims, 17 Drawing Sheets

COMB PATTERN INSERT FOR WAVE SOLDER PALLETS

TECHNICAL FIELD

This disclosure relates to wave soldering. More particularly, this disclosure relates to wave soldering of small-pitch electrical leads.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

Figure 1:
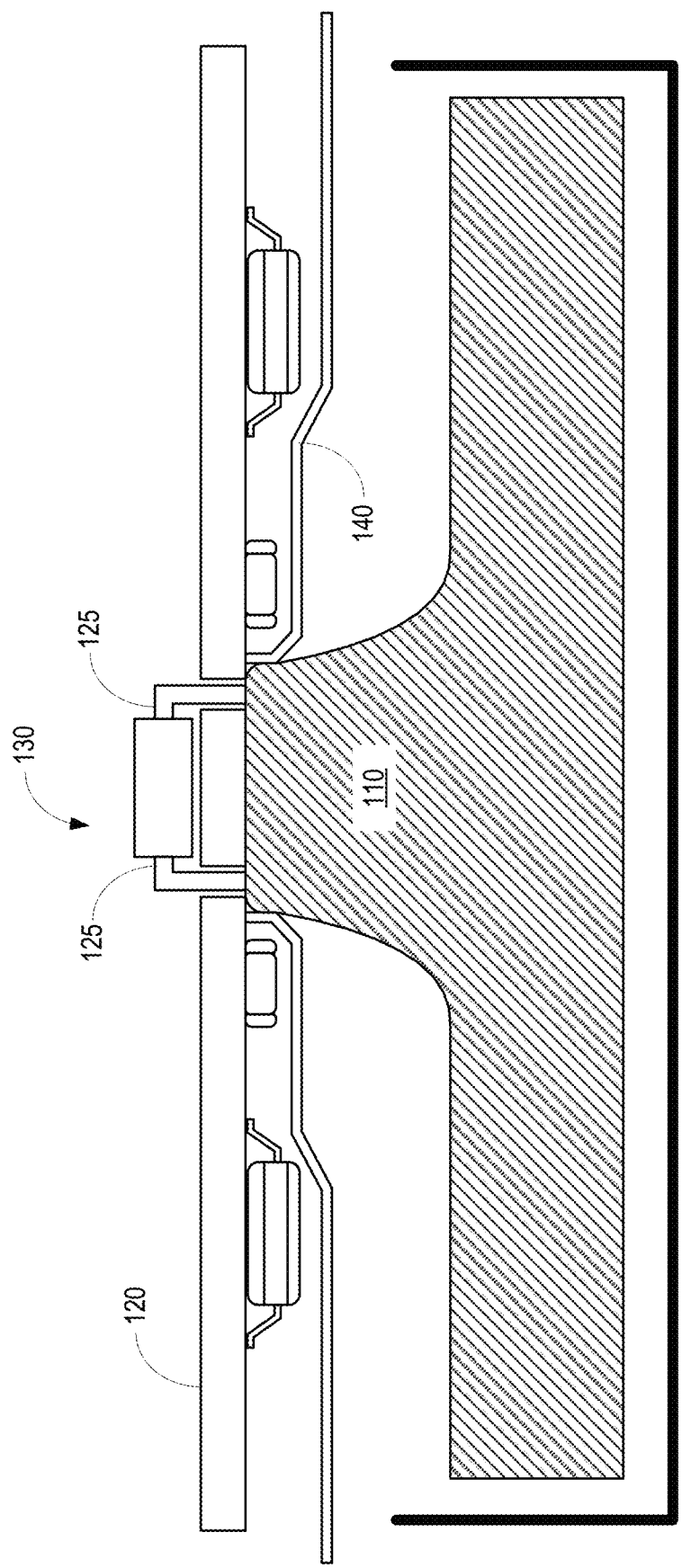
FIG. 1 illustrates an example representation of a circuit board where previously mounted components are protected by a wave solder pallet during the application of solder to leads of through-hole components.

Wave soldering is a fabrication technique employed in the production of printed circuit boards. The leads of electronic components installed in a printed circuit board are soldered to the board via a wave of solder. Electronic designs may incorporate one or more technologies including, for example, surface-mount and through-hole components. Many through-hole components have small-pitch electrical leads. Solder bridging between adjacent electrical leads may occur when wave soldering small-pitch electrical leads. Bridges of solder between adjacent electrical leads can result in undesirable short circuits, improper operation, and/or system failures. Minimizing or eliminating bridging may increase product yield and/or decrease production cost.

Previous approaches for dealing with solder bridging include discarding defective products, repairing defective products, and/or hand assembling components with small-pitch electrical connections. These approaches are time and labor intensive, increase the cost of production, and/or increase time to delivery.

Printed circuit board fabrication processes may utilize multiple production steps where some components may be soldered to the circuit board in one step, and other components may be soldered in subsequent steps. A wave solder pallet may be stacked between the solder and the printed circuit board to protect previously soldered components from excess heat and/or prevent previously soldered components from becoming unsoldered as they travel through the wave of solder. The printed circuit board may be attached to the wave solder pallet by a set of circuit board hold-downs (or other retainers) to ensure alignment or registration through the wave soldering process. The wave solder pallet has wave pockets (or other aperture) that facilitate the application of solder to the portion of the circuit board where new components are to be attached.

A printed circuit board may have multiple discrete areas where new components are to be soldered. The circuit board may also include multiple discrete areas with previously soldered components that need to be protected. As a circuit board progresses through a wave of solder, a wave solder pallet protects each area requiring protection, while wave pockets allow solder to make contact with the circuit board where new components are to be soldered.

The circuit board side of a wave solder pallet may include circuit board hold-downs intended to maintain proper registration between the circuit board and the pallet. The solder side of a wave solder pallet may include gas grooves that allow gases to escape without disrupting proper solder flow.

Circuit boards containing components with multiple adjacent rows of small-pitched through-hole leads may be oriented so leads within a row travel through the wave of solder in single file order (i.e., the rows of small-pitched leads are aligned perpendicular to the relative motion of the wave of solder). As adjacent leads in multiple parallel rows are exposed to a wave of solder, through a wave solder pallet's wave pocket, solder bridging may occur between leads in parallel rows. This undesirable bridging electrically connects or shorts adjacent component leads resulting in a defective circuit board. Design processes, soldering techniques and/or tooling to eliminate bridging may increase yield and reduce production costs.

Solder bridging of small-pitched though-hole components can be reduced or eliminated through the use of the wave solder pallet inserts described herein. Wave solder pallet inserts may be made of a material that is durable and effectively resists being soldered. The insert pattern of a solder pallet insert may be adapted based on the number of adjacent rows of small-pitched leads. For instance, solder bridging between two rows of adjacent leads may be reduced or even eliminated by an insert pattern where the peeling members extend only partially between opposing edges of the wave solder pallet insert (e.g., three-quarters, halfway, one-quarter, one-tenth, etc.). More than two rows of small-pitched leads may benefit from an insert pattern where the peeling members are implemented as a grating that extends between opposing edges of the wave solder pallet insert.

In some embodiments, one or more wave solder pallet inserts may be attached to the solder side of a wave solder pallet. In other embodiments, and as generally described herein, one or more wave solder pallet inserts are attached (e.g., snapped in place, screwed, glued, and/or otherwise fastened or fitted) to a wave solder pallet on the circuit board side of the pallet. A circuit board may be placed on top of the wave solder pallet and the attached wave solder pallet insert(s). The circuit board may be attached to the pallet by the hold-downs. The wave solder pallet inserts are exposed to solder through the wave solder pallet's wave pockets. The insert pattern of the wave solder pallet insert enables the solder to reach the component leads requiring soldering, but prevents (e.g., peals) solder away from those areas susceptible to bridging.

The use of wave solder pallet inserts eliminates or at least reduces solder bridging between adjacent leads of small-pitched through-hole components. Thus, the various embodiments of wave solder pallet inserts described herein decrease production time, result in higher yield, and/or decreases production cost. Many of the wave solder pallet inserts described herein may be used with existing wave solder pallets (i.e., retrofit). In other embodiments, wave solder pallets may be pre-configured (e.g., include mounting holes, depressions, protrusions, etc.) to accommodate one or more wave solder pallet inserts.

It is particularly appreciated that many of the components could be resized, reshaped, lengthened, shortened, etc. It is also appreciated that a wide variety of connections, couplings, and fasteners could be utilized in addition to or as alternatives to those shown in the figures. In fact, many possible options are not explicitly illustrated to avoid obscuring other aspects of the illustrated embodiments. The various components described herein may be manufactured using a wide variety of metals, plastics, woods, and/or other materials known to be useful in manufacturing.

The phrases "connected to," "coupled to," and "in communication with" refer to any form of interaction between two or more components, including mechanical, electrical, magnetic, and electromagnetic interaction, depending on the context. Two components may be connected to each other, even though they are not in direct contact with each other, and even though there may be intermediary devices between the two components.

The words "solder," "soldering," "soldered," and the like refer to the joint between metal objects being connected by the application of any of various molten alloys using any of a wide variety of processes.

Many of the embodiments of the disclosure can be further understood by reference to the drawings, wherein like parts are designated by like numerals throughout. The components of the disclosed embodiments, as generally described and illustrated in the figures herein, could be arranged and designed in a wide variety of different configurations. Thus, the following description of the embodiments of the systems and methods of the disclosure is not intended to limit the scope of the disclosure, as claimed, but is merely representative of possible embodiments.

FIG. 1 illustrates a fabrication technique employed in the production of printed circuit boards known as wave soldering. Electronic designs often include multiple electronic components, such as surface-mount and/or through-hole components. The leads 125 of a through-hole electronic component 130 may be soldered to a printed circuit board 120 via a wave of solder 110 contacting a portion of the printed circuit board 120.

As illustrated, the circuit board 120 is populated with previously soldered surface-mount components and the through-hole component 130 requiring soldering. The circuit board 120 is attached to a wave solder pallet 140 that protects the previously mounted components from becoming damaged and/or unsoldered. A wave pocket of the wave solder pallet 140 facilitates the wave of solder 110 reaching the circuit board 120 and the leads 125 of the through-hole component 130.

Figure 2A:
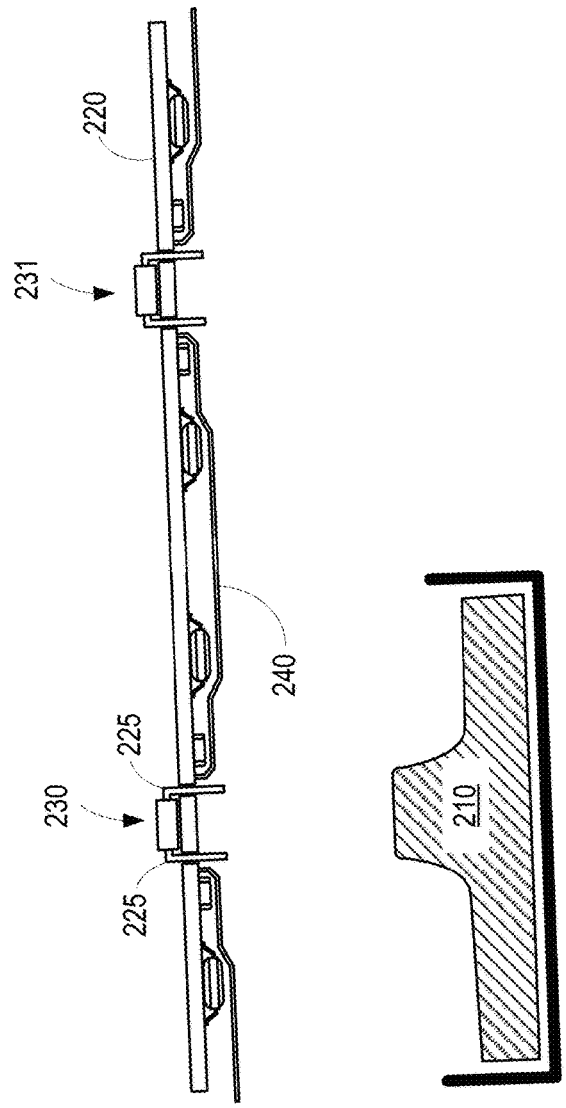
FIG. 2A illustrates an example representation of a previously populated circuit board and an attached wave solder pallet above a wave of solder before solder is applied to the leads of through-hole components.

FIG. 2A illustrates a circuit board 220 containing previously soldered surface-mount components with leads 225 and through-hole components 230 and 231 requiring soldering. The circuit board 220 is connected to a wave solder pallet 240 in preparation for soldering by a solder wave 210 in a wave solder production process.

Figure 2B:
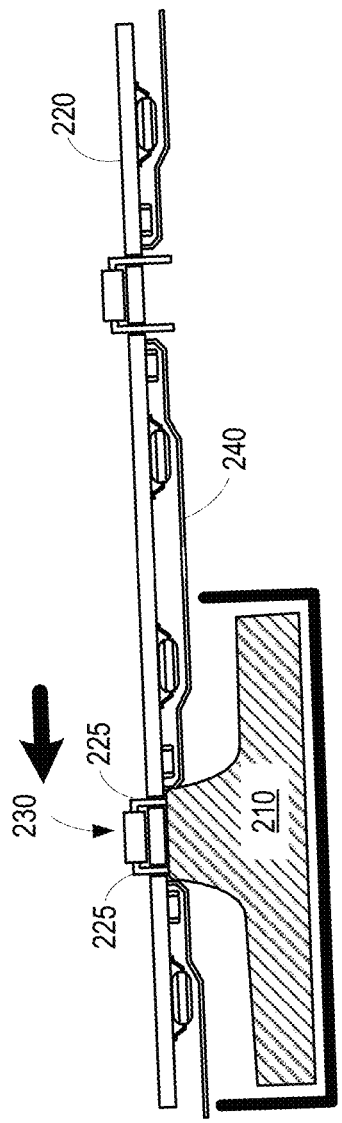
FIG. 2B illustrates the example representation of the circuit board and attached wave solder pallet moving from right to left over the wave of solder being applied to the leads of a first through-hole components.

FIG. 2B illustrates the circuit board 220, associated components, and the wave solder pallet 240 moving from right to left over the wave of solder 210 applied to the leads 225 of the first through-hole component 230. The surface-mount components, to the left of the wave of solder 210, were protected by the wave solder pallet 240, as they passed over the wave of solder 210.

The first wave pocket of the wave solder pallet 240 facilitates the wave of solder 210 reaching the circuit board 220 and the leads 225 of the through-hole component 230. As the circuit board 220 and associated components pass through the wave of solder 210, the leads 225 of the component 230 and associated circuit board connection points are heated and solder from the wave of solder 210 joins them (e.g., electrically and physically).

Figure 2C:
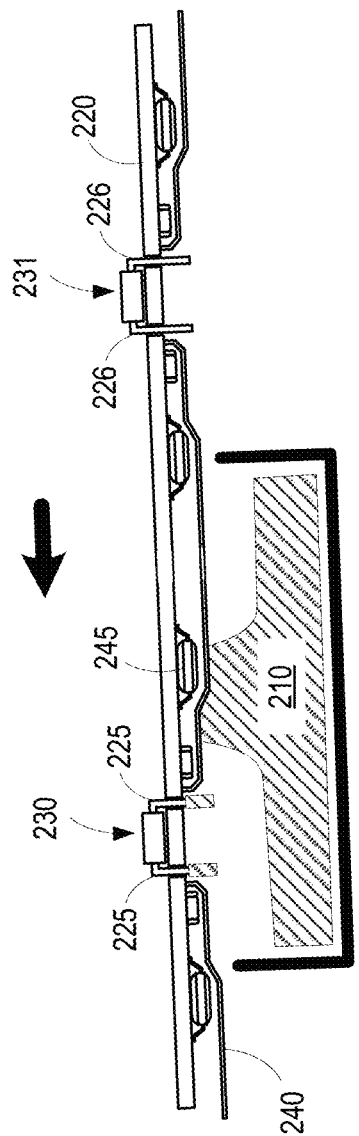
FIG. 2C illustrates the example representation of the circuit board and attached wave solder pallet moving from right to left over the wave of solder beneath an area of the circuit board where previously attached components are protected.

FIG. 2C illustrates continued progress of the circuit board 220, associated components, and the wave solder pallet 240 as it moves from right to left through the wave soldering process. At this point in the process, the wave of solder 210 is making contact with the wave solder pallet 240 that is protecting the underlying surface-mount components (e.g., surface mount component 245). The leads 225 of the first through-hole component 230 are shown with applied solder, while the leads 226 of the second through-hole component 231 are not yet soldered.

Figure 2D:
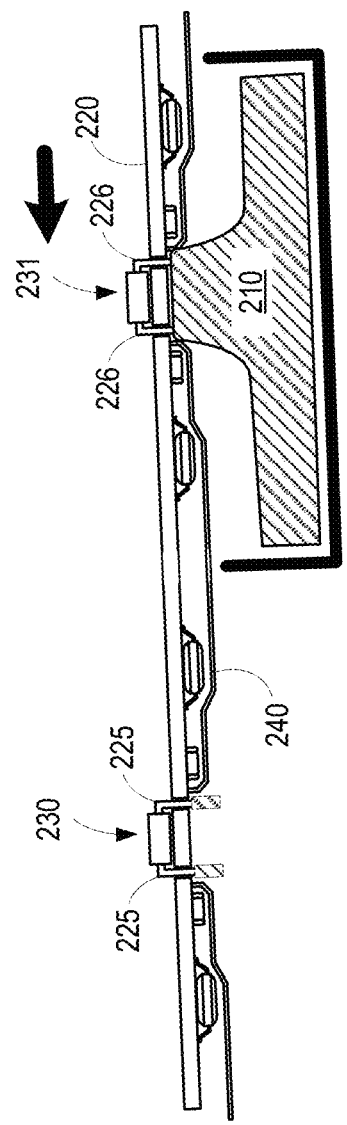
FIG. 2D illustrates the example representation of the circuit board and attached wave solder pallet moving from right to left over the wave of solder that is being applied to a second through-hole components.

FIG. 2D illustrates the circuit board 220, associated components, and the wave solder pallet 240 making progress as it moves from right to left through the wave soldering process. The wave of solder 210 is in contact with the leads 226 of the second through-hole component 231 and the associated region of the circuit board. The wave of solder 210 heats the leads 226 of the second through-hole component 231 and the associated connection points of the circuit board 220, and solder-joins them.

Figure 2E:
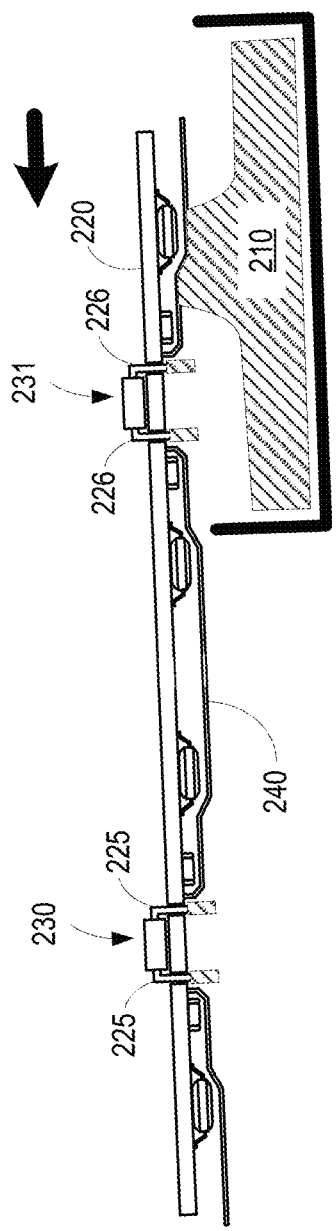
FIG. 2E illustrates the example representation of the circuit board and attached wave solder pallet moving from right to left over the wave of solder beneath an area of the circuit board where previously attached components are protected.

FIG. 2E illustrates continued progress of a circuit board 220, associated components, and a wave solder pallet 240 as it moves from right to left through the wave soldering process. As illustrated, the wave of solder 210 is in contact with the wave solder pallet 240 protecting previously soldered surface-mount components. The leads 226 of the second through-hole component 231 are shown with applied solder electrically (and optionally physically) joining the leads 226 to the associated connection points of the circuit board 220.

Figure 3A:
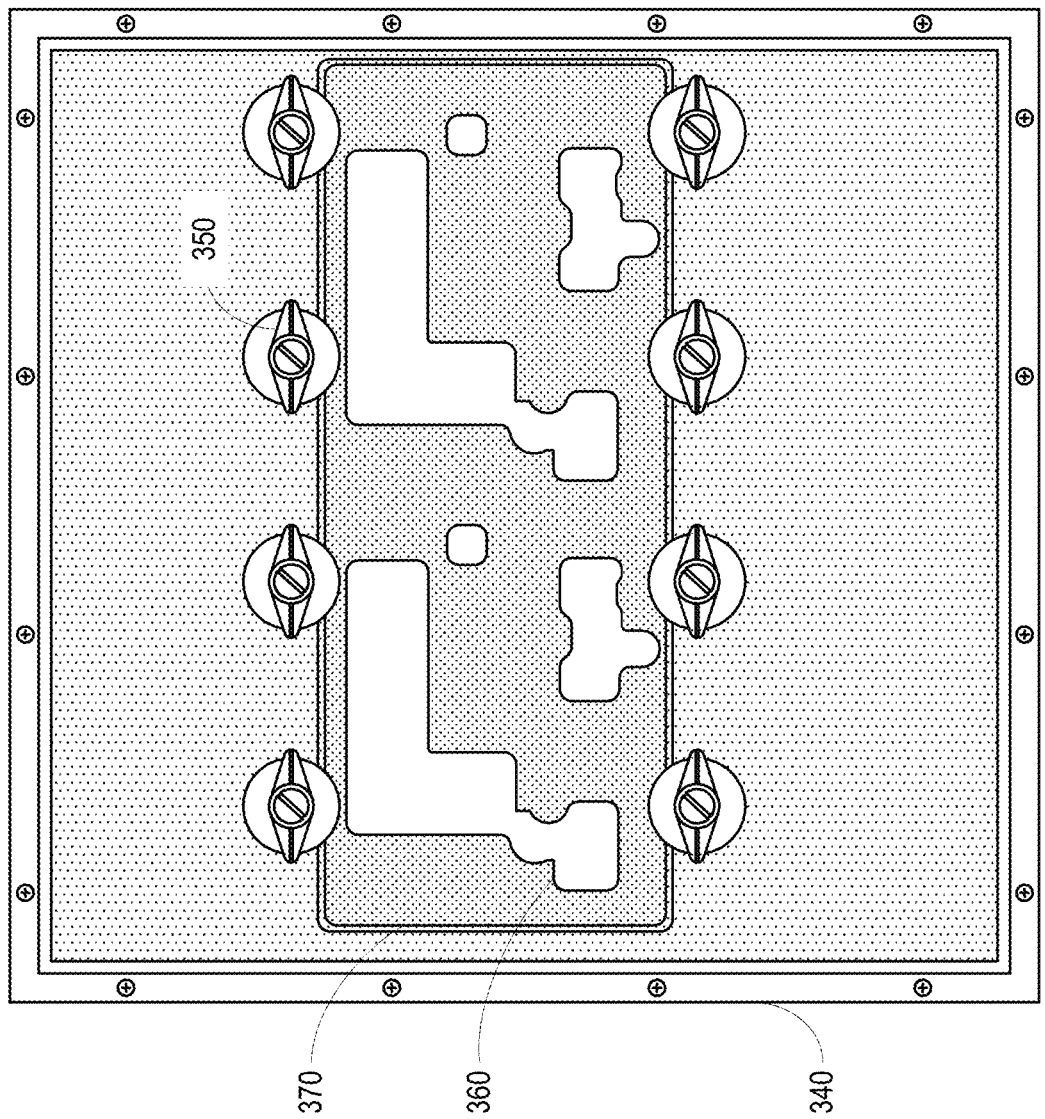
FIG. 3A illustrates a printed circuit board side of a wave solder pallet including various wave pockets (or another aperture) and printed circuit board hold-downs (or another circuit board retains), according to one embodiment.

FIG. 3A illustrates the printed circuit board side of a wave solder pallet 340 including wave pockets 360 (shown in white in the center) and printed circuit board hold-downs 350 (only one of the eight is labeled). The wave pockets 360 are holes or apertures in the wave solder pallet 340 that enable a solder wave to reach up through the wave pockets 360 and contact component leads and a circuit board retained within a region 370.

The circuit board hold-downs 350, illustrated in their open position, hold the circuit board in place as the circuit board, associated components, and the wave solder pallet 340 progress through the production process. The circuit board hold-downs 350 maintain proper registration between the circuit board and the wave pallet pockets 360 to ensure solder is applied only to the appropriate regions of the circuit board. Where there are no wave pockets (patterned areas), the wave solder pallet protects previously soldered components.

Figure 3B:
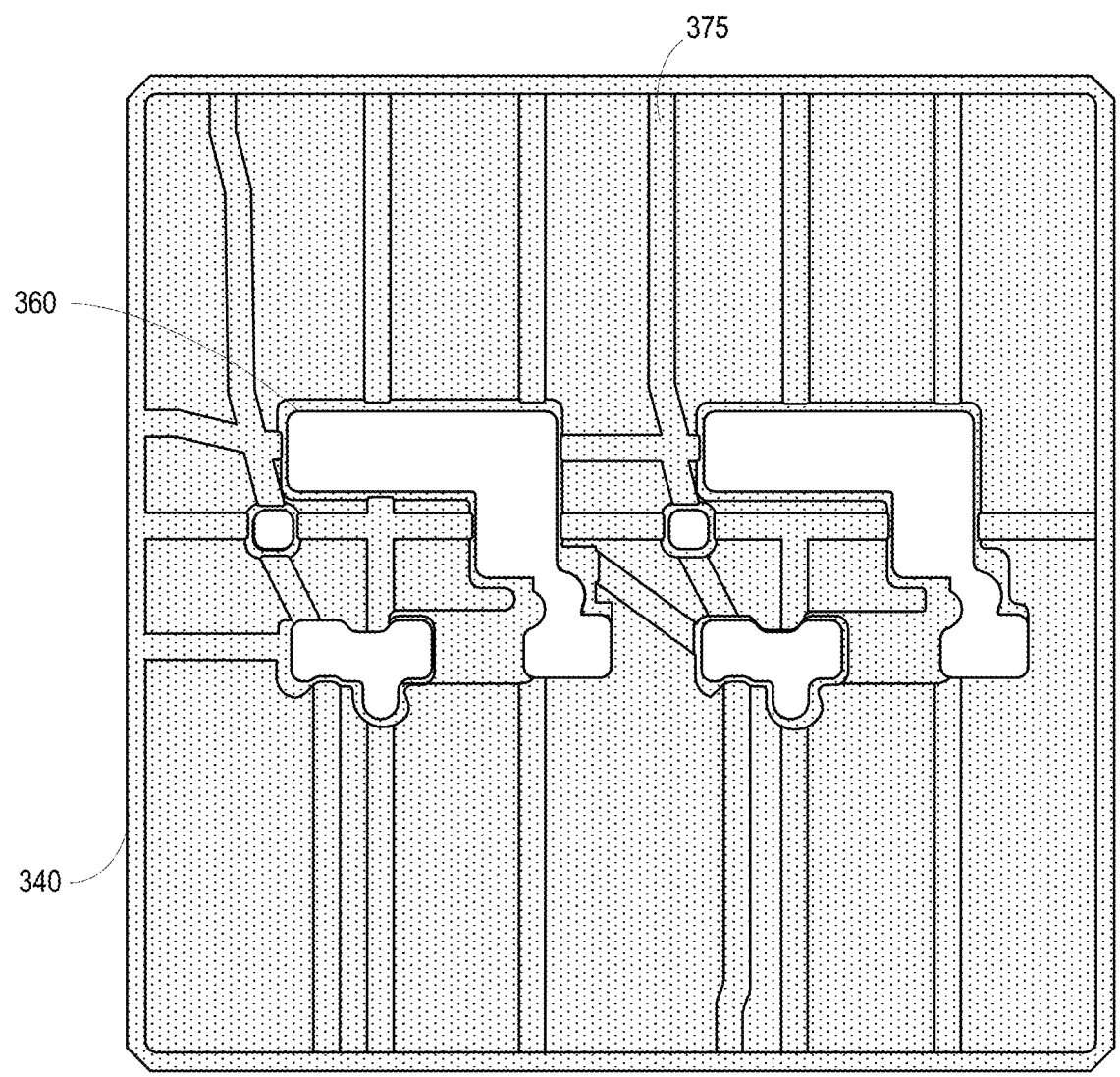
FIG. 3B illustrates the solder side of the wave solder pallet with wave pockets and gas grooves, according to one embodiment.

FIG. 3B illustrates the solder side of the wave solder pallet 340 with wave pockets 360 and gas grooves 375. As described herein, the wave pallet pockets 360 expose the appropriate circuit board regions and accompanying leads of one or more components to the solder wave. Other regions of the circuit board are not exposed to the wave of solder, because they are protected by the wave solder pallet 340.

The gas grooves 375 in the wave solder pallet 340 allow gases from the solder wave to easily escape from under the wave solder pallet 340. Allowing the gases to escape in a controlled manner reduces the risk of interfering with the proper flow of solder. This can contribute to a more reliable production process in some embodiments.

Figure 4A:
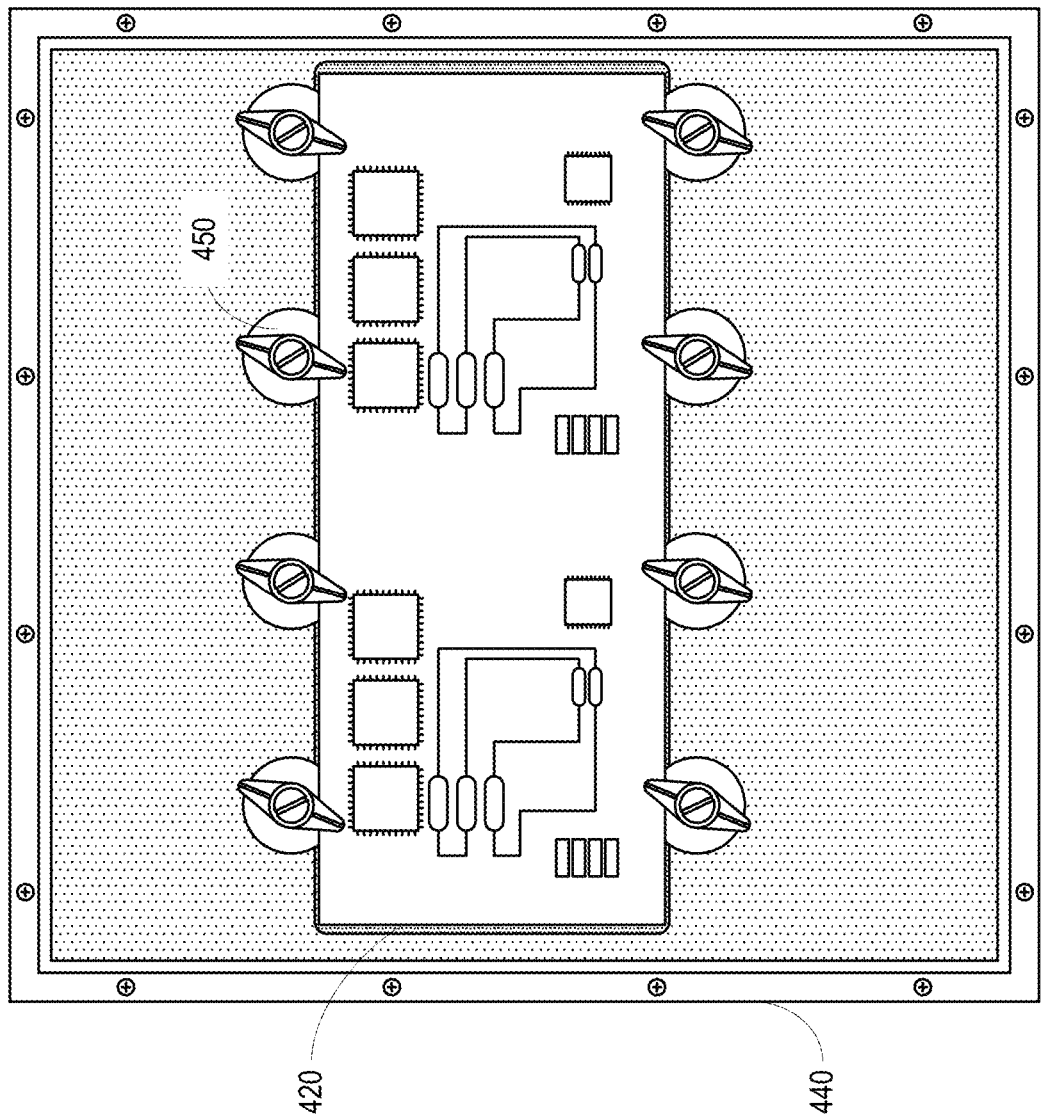
FIG. 4A illustrates a printed circuit board side of a wave solder pallet with a circuit board secured via printed circuit board hold-downs, according to one embodiment.

FIG. 4A illustrates the printed circuit board side of a wave solder pallet 440 with a circuit board 420 secured by the printed circuit board hold-downs 450. With the hold-downs 450 in their open position, the circuit board 420 can be placed on the wave solder pallet 440. After the circuit board 420 is properly arranged on the wave solder pallet 440, the hold-downs 450 can be closed, as illustrated. The hold-downs 450 maintain proper registration between the circuit board 420 and the wave solder pallet 440 throughout the wave soldering process.

Components previously attached to the printed circuit board side of the circuit board 420 are visible, as are the top side of any through-hole components requiring soldering. The wave solder pallet 440 protects components on the other side of the circuit board that do not require additional soldering. The wave pockets of the wave solder pallet 440 allow the wave of solder to reach areas of the circuit board 420 requiring soldering.

Figure 4B:
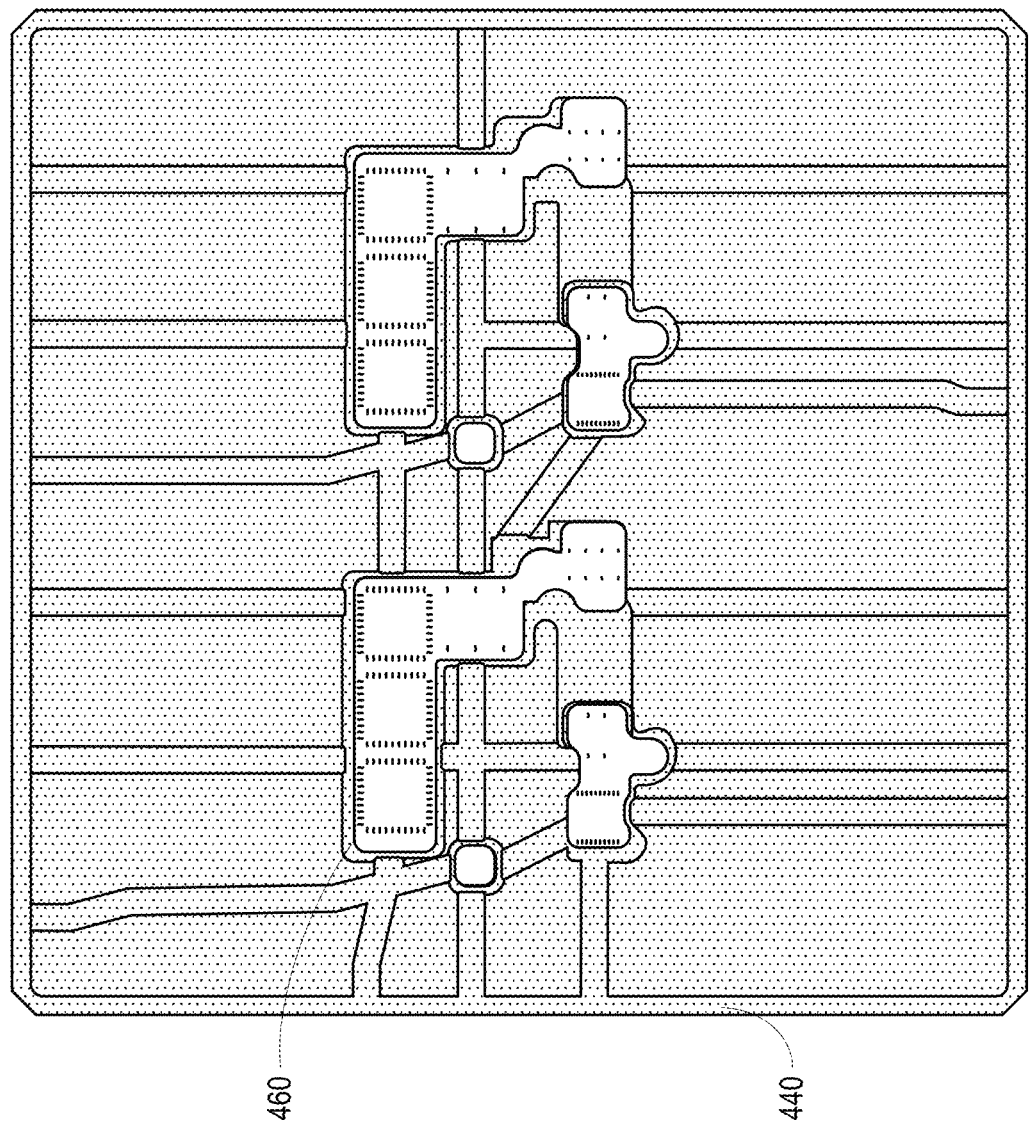
FIG. 4B illustrates the solder side of the wave solder pallet with through-hole component leads of the attached circuit board exposed through wave pockets in the wave solder pallet, according to one embodiment.

FIG. 4B illustrates the solder side of a wave solder pallet 440 with an attached circuit board with through-hole component leads (shown as small dashes) exposed through the wave pockets 460. The wave pockets 460 are aligned with the areas of the circuit board where soldering is required. These areas contain component leads and associated circuit board connections. As the wave of solder extends through the wave pocket it makes contact with the circuit board and the through-hole component leads. These areas are heated and solder is applied.

Where small-pitch through-hole components are installed and their leads extend into wave pockets 460 of the wave solder pallet, solder is applied. Due to the small-pitch leads of these components, solder bridging may occur using standard processes. The inclusion of wave solder pallet inserts, as described herein, eliminates or reduces solder bridging.

Figure 5A:
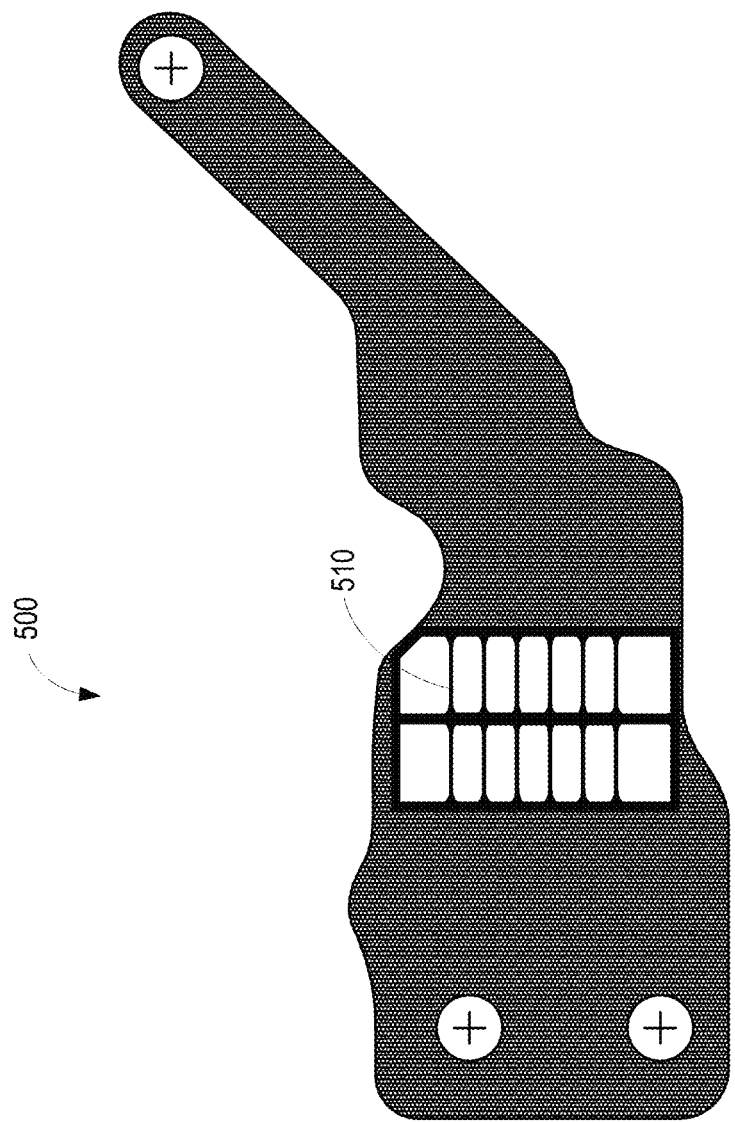
FIG. 5A illustrates an example of a wave solder pallet insert where the peeling members are implemented as a grating that extends between opposing edges of the insert.

FIG. 5A illustrates a wave solder pallet insert 500 where the peeling members 510 are implemented as a grating that extends between opposing edges of the wave solder pallet insert. Wave solder pallet inserts may be implemented using any of a wide variety of materials that are durable and resist being soldered. In many embodiments, they are thin to enable them to be placed between a wave solder pallet and a circuit board without interfering with the circuit board attachment process or mechanisms. In some embodiments, the surface of the wave solder pallet insert 500 that contacts the circuit board may be insulated (thermally and/or electrically).

A wave solder pallet insert 500 may extend beyond the boundaries of an intended wave pocket to enable attachment to a wave solder pallet (e.g., via screws). The odd shape shown may be specifically adapted to fit within unused or relatively low-profile components on the circuit board, while still providing a sufficiently large mounting surface for attachment.

The grating of peeling members 510 are arranged to accommodate rows of component leads that extend vertically. The wave solder pallet, the wave solder pallet insert 500, and an associated circuit board may proceed through a solder wave that extends from right to left (or left to right). In this configuration, the wave solder pallet insert 500 is intended to eliminate solder bridging between pairs of adjacent component leads in each of the two rows.

While FIG. 5A illustrates a wave solder pallet insert 500 for a through-hole component with two rows of adjacent leads, this particular grating pattern of peeling members is particularly suited to eliminate solder bridges between adjacent component leads of components that have two rows of leads (as illustrated), or for components that have more than two rows of leads.

Figure 5B:
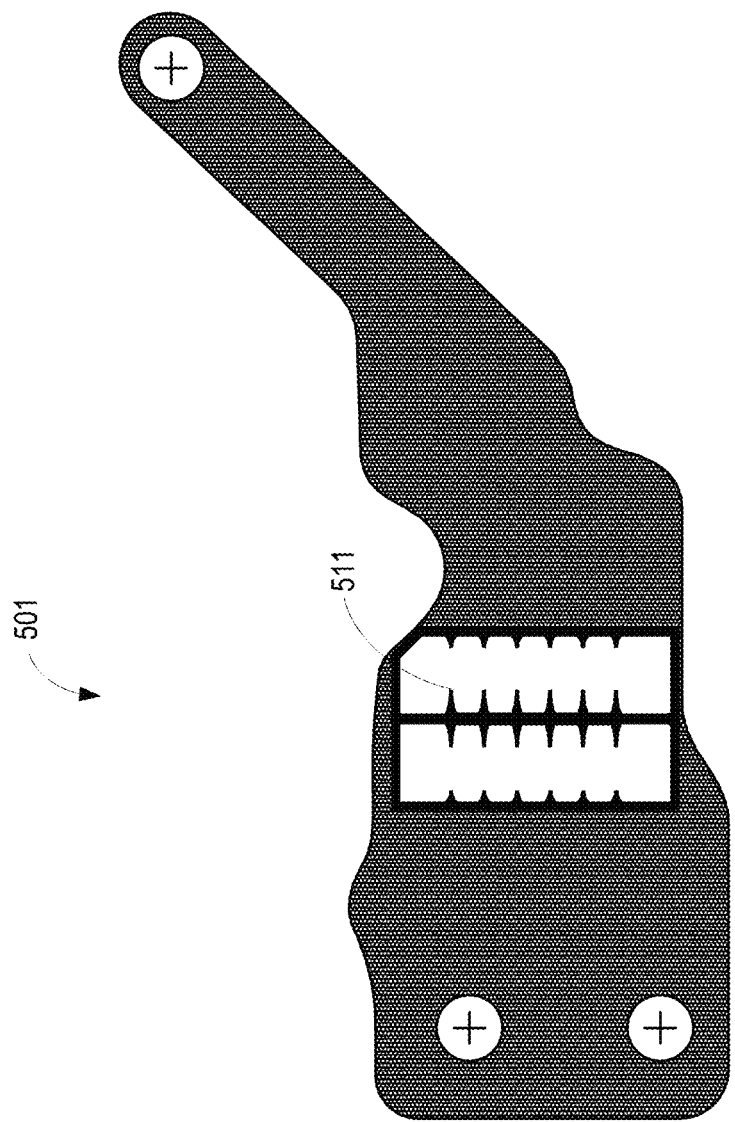
FIG. 5B illustrates an example of a wave solder pallet insert where the peeling members extend nearly halfway between each of the opposing edges of the wave solder pallet insert.

FIG. 5B illustrates a wave solder pallet insert 501 where the peeling members 511 extend nearly halfway between each of the opposing edges of the wave solder pallet insert 501. The peeling member pattern 511 of this insert is particularly adapted to eliminate solder bridging of adjacent leads of components with two rows of leads.

Figure 5C:
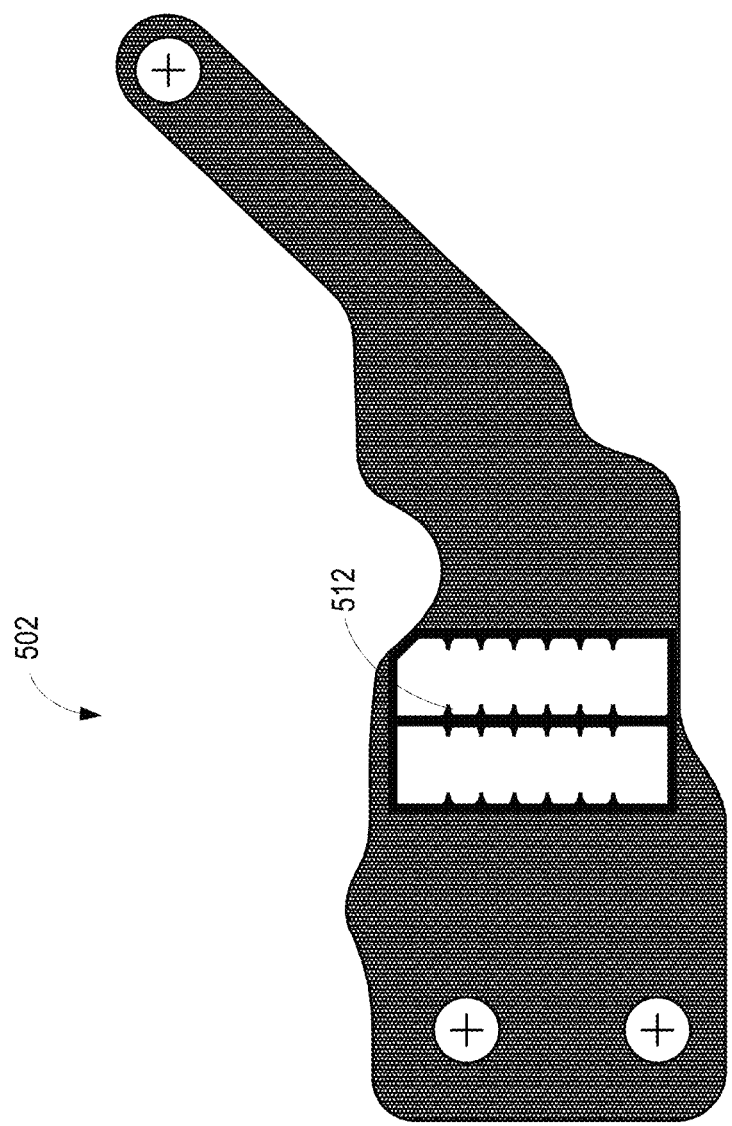
FIG. 5C illustrates an example of a wave solder pallet insert where the peeling members extend only partially into the space between each of the opposing edges of the wave solder pallet insert.

FIG. 5C illustrates a wave solder pallet insert 502 where the peeling members 512 extend only partially into the space between each of the opposing edges of the wave solder pallet insert 502. The peeling member pattern 512 of the illustrated wave solder pallet insert 502 is particularly useful to eliminate solder bridging of adjacent leads of components with two rows of leads. In some embodiments, a wave solder pallet insert may be configured with any size and/or combination of peeling members with any number of grate patterns, peeling member spacings, and/or partially extending peeling members to correspond to the leads of any number and/or arrangement of through-hole components within one or more wave pockets.

Figure 6A:
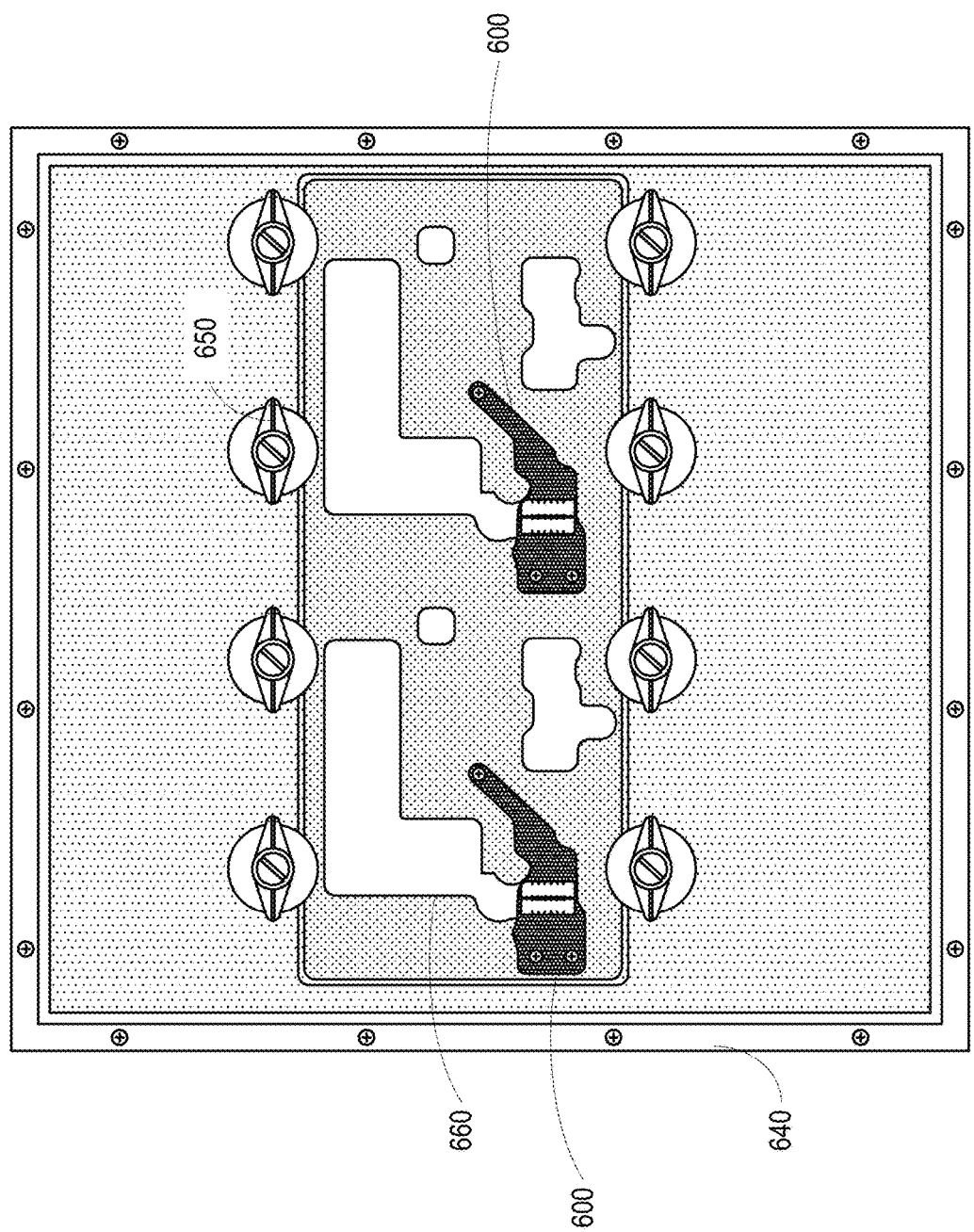
FIG. 6A illustrates wave solder pallet inserts installed on the circuit board side of a wave solder pallet, according to one embodiment.

FIG. 6A illustrates wave solder pallet inserts 600 installed on the circuit board side of a wave solder pallet 640. The wave solder pallet inserts 600 include insert extensions that extend beyond the borders of the wave pockets 660 to locations where the insert extensions can be attached to the wave solder pallet 640. The insert extensions extend over wave solder pallet material. Consequently, they do not inhibit solder flow within other unrelated wave pockets 660. In some embodiments, wave solder pallet inserts 600 are thin enough to permit circuit boards to be placed over them and secured to the wave solder pallet 640 with the circuit board hold-downs 650, as previously described.

The illustrated wave solder pallet inserts 600 can be replaced with wave solder pallet inserts of various patterns, shapes, sizes, peeling member arrangements, peeling member spacings, and the like to meet specific needs. The illustrated wave solder pallet inserts are useful for eliminating solder bridging across adjacent leads of components with two rows of leads. As previously discussed, inserts with a grating pattern may be more effective at eliminating solder bridging across adjacent leads of components with more than two rows of leads.

Figure 6B:
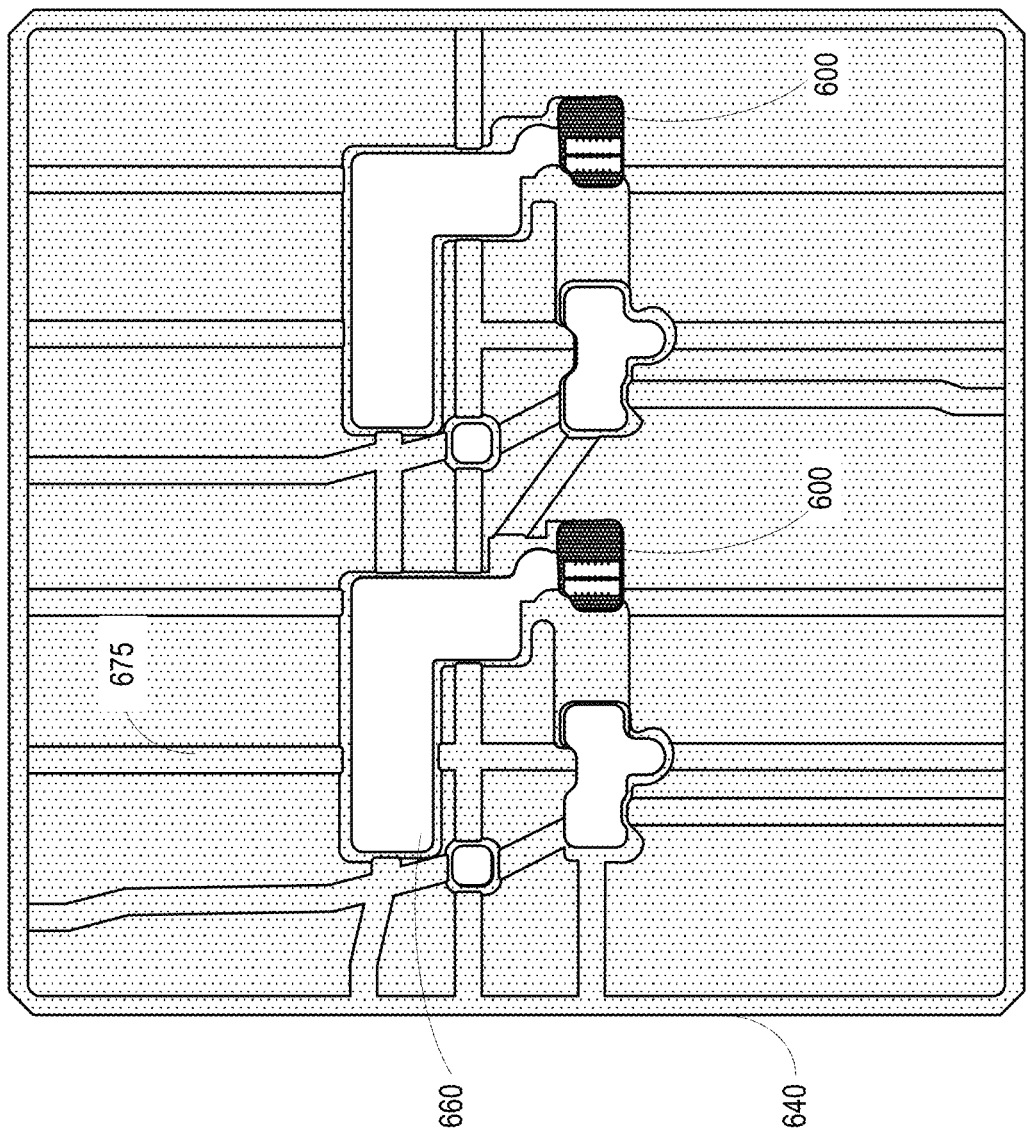
FIG. 6B illustrates the wave solder pallet inserts visible through wave pockets from the solder side of the wave solder pallet, according to one embodiment.

FIG. 6B illustrates wave solder pallet inserts 600 as they appear on the solder side of the wave solder pallet 640. The wave solder pallet inserts 600 may be specifically sized to only cover wave pockets 660 where they are intended to eliminate solder bridging of small-pitched component leads. The insert extensions used to connect the wave solder pallet inserts 600 to the pallet are not visible in FIG. 6B because the extensions are routed over areas of the wave solder pallet that do not interfere with wave pockets and may be any shape or size.

The wave solder pallet inserts 600 allow solder to reach the circuit board and component leads where necessary, but peel solder (e.g., prevent solder from adhering in the first place, or remove it after adhesion) away from areas where bridging would otherwise occurs. As described herein, the illustrated wave solder pallet inserts 600 can be replaced or supplemented with inserts of various patterns to meet specific needs. In many embodiments, wave solder pallet inserts 600 do not adversely interfere with the flow of solder in other wave pockets 660. In embodiments in which the wave solder pallet inserts 600 are installed on the circuit board side of the wave solder pallet 640, they do not adversely interfere with the behavior of the gas grooves 675.

Figure 7A:
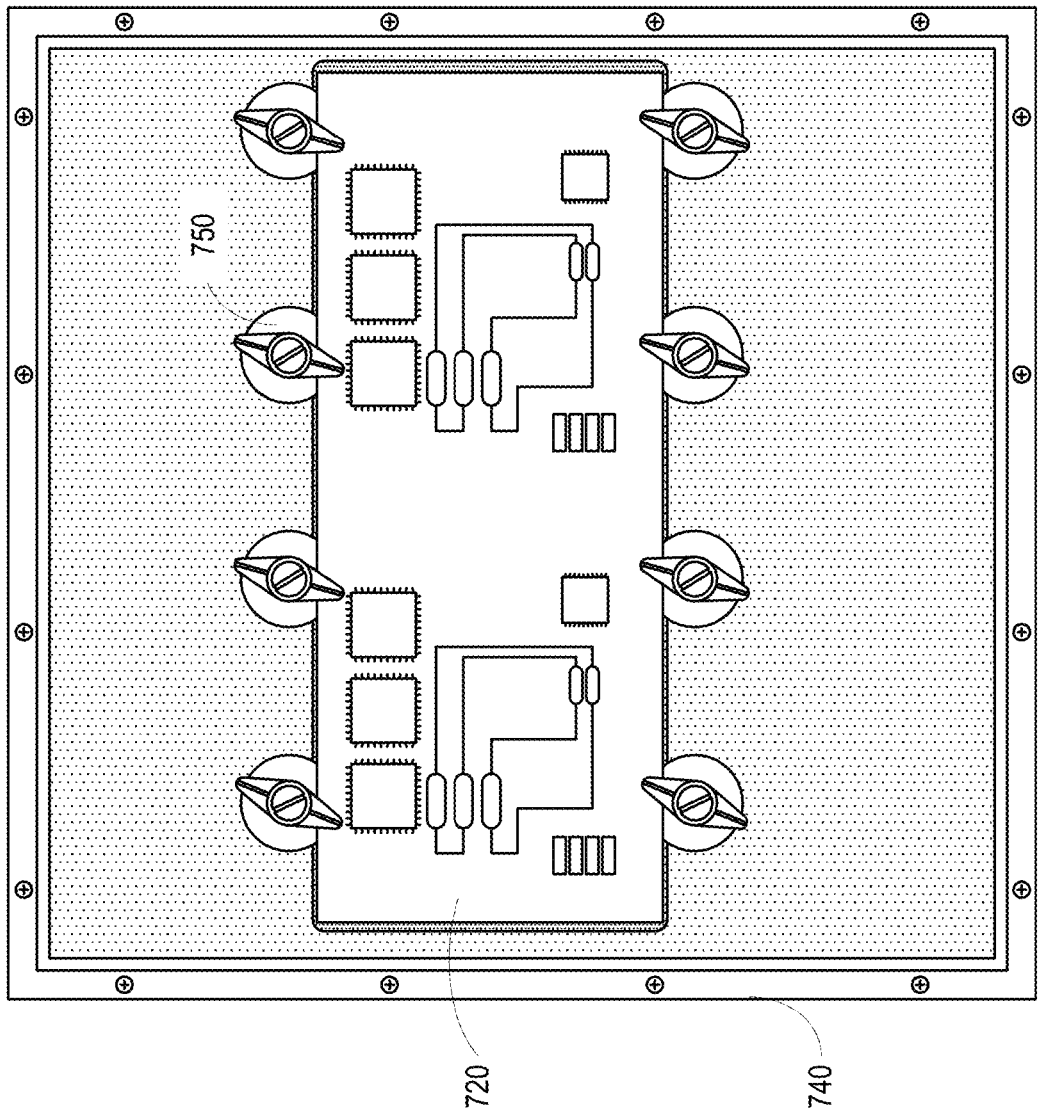
FIG. 7A illustrates a circuit board mounted on top of the wave solder pallet and associated wave solder pallet inserts, according to one embodiment.

FIG. 7A illustrates a circuit board 720 mounted on top of the wave solder pallet 740 and associated wave solder pallet inserts (not visible beneath the circuit board). As described herein, the wave solder pallet inserts are attached to the wave solder pallet 740 and may be thin enough to permit the circuit board 720 to be secured via the hold-downs 750.

Figure 7C:
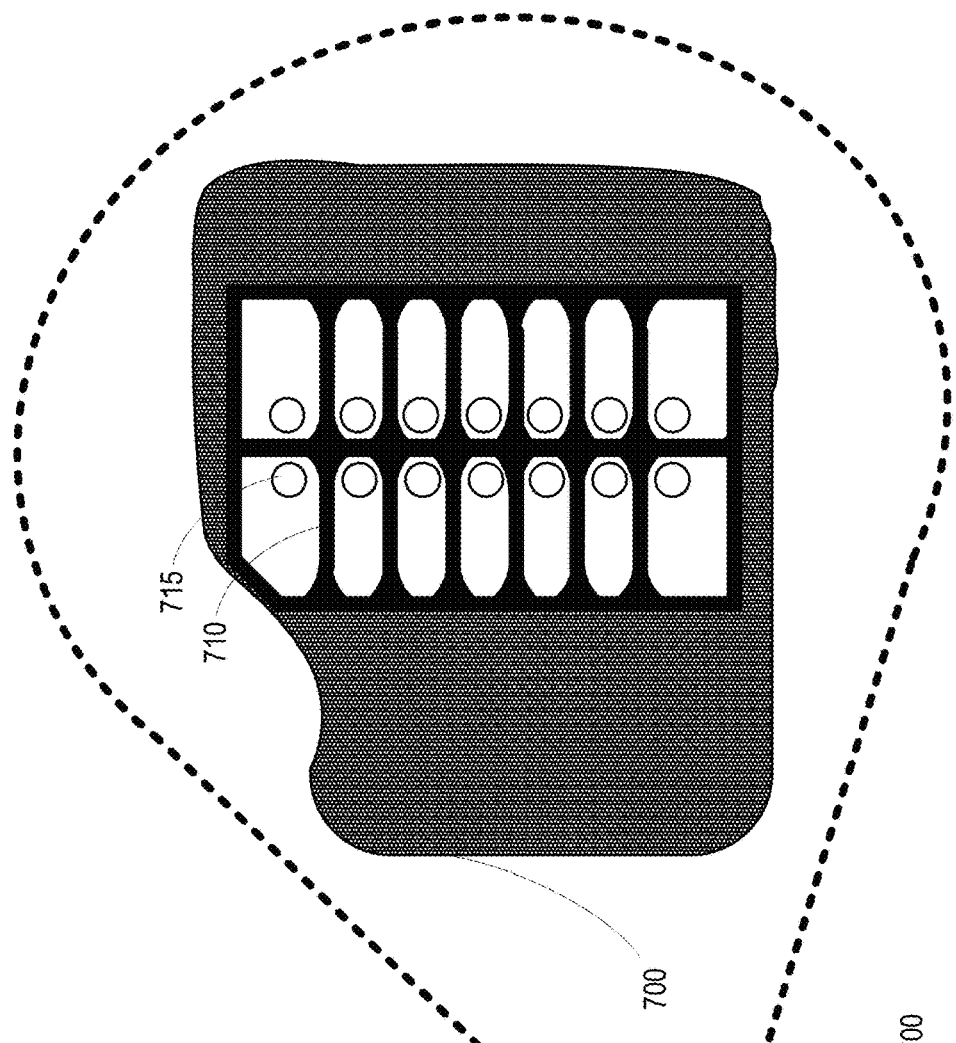
FIG. 7C illustrates an enlarged view of the wave solder pallet insert where peeling members of the wave solder pallet insert extend between opposing edges of the wave solder pallet insert.
Figure 7B:
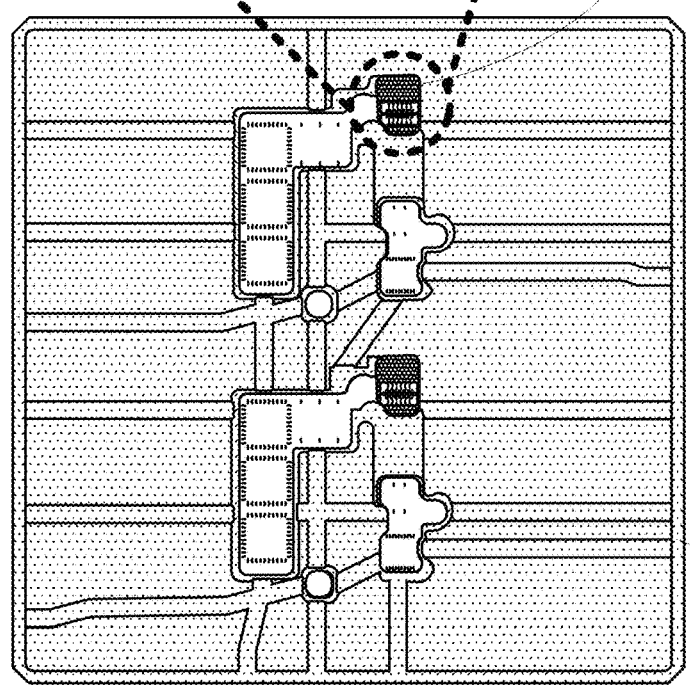
FIG. 7B illustrates the wave solder pallet, wave solder pallet inserts, and attached printed circuit board with protruding through-hole component leads, according to one embodiment.

FIG. 7B illustrates a wave solder pallet 740, wave solder pallet inserts 700 and an attached printed circuit board with leads 715 of one or more through-hole components protruding through wave pockets. The wave solder pallet inserts 700 do not adversely interfere with solder flow in wave pockets where components without small-pitch leads are located. They also do not adversely interfere with the functionality of the gas grooves.

FIG. 7C illustrates an enlarged view of a wave solder pallet insert where peeling members 710 of the wave pallet solder insert 700 extend between opposing edges of the wave pallet solder insert 700. While FIG. 7C illustrates two rows of leads 715, this particular insert pattern may be adapted to eliminate bridging between adjacent leads of components with any number of leads. The illustrated wave pallet solder insert can be replaced with any of the various embodiments or combination of embodiments of wave pallet solder inserts described herein. For example, the wave pallet solder insert described in conjunction with FIGS. 5A, 5B, and/or 5C could be utilized in place of the wave pallet solder insert 700.

As described herein, the use of one or more wave solder pallet inserts and the selection of the correct insert pattern(s) can eliminate or at least reduce solder bridging between adjacent leads of small-pitch through-hole electronic components.

Specific embodiments and applications of the disclosure are described above and illustrated in the figures. It is, however, understood that many adaptations and modifications can be made to the precise configurations and components detailed above. In some cases, well-known features, structures, or operations are not shown or described in detail. Furthermore, the described features, structures, or operations may be combined in any suitable manner in one or more embodiments. It is also appreciated that the components of the embodiments as generally described and illustrated in the figures herein could be arranged and designed in a wide variety of different configurations. Thus, all feasible permutations and combinations of embodiments are contemplated.

In the description above, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims are hereby expressly incorporated into this Detailed Description, with each claim standing on its own as a separate embodiment. This disclosure includes all permutations and combinations of the independent claims with their dependent claims.

It will be apparent to those having skill in the art that changes may be made to the details of the above-described embodiments without departing from the underlying principles of the invention.

What is claimed is:

1. A wave solder pallet with an insert for small-pitch electrical leads, comprising:
    a support panel;
    at least one retainer to selectively retain a circuit board on an upper surface of the support panel;
    an aperture in the support panel to expose a plurality of electrical leads of one or more through-hole components in the circuit board;
    a wave solder insert connected to the support panel proximate the aperture, the insert comprising
        a peeling member that extends at least partially between two adjacent electrical leads of the plurality of electrical leads,
        wherein the peeling member reduces bridging of the two adjacent electrical leads during a wave solder process.

2. The system of claim 1, wherein the plurality of electrical leads comprises a row of electrical leads, and wherein the wave solder insert comprises a corresponding plurality of peeling members that extend only partially between each of the electrical leads.

3. The system of claim 1, wherein the plurality of electrical leads comprises a row of electrical leads with a constant pitch spacing, and wherein the wave solder insert comprises a plurality of peeling members with a corresponding constant pitch spacing.

4. The system of claim 1, wherein the plurality of electrical leads comprises a row of electrical leads with non-uniform spacing, and wherein the wave solder insert comprises a plurality of peeling members with a corresponding non-uniform spacing.

5. The system of claim 4, wherein the peeling members have varying widths, with each peeling member having a width that corresponds to a distance between the electrical leads separated by each respective peeling member.

6. The system of claim 1, wherein the at least one retainer comprises at least one rotatable circuit board hold-down.

7. The system of claim 1, wherein the aperture in the support panel comprises a wave pocket to receive a solder wave.

8. The system of claim 1, wherein the plurality of electrical leads comprises a row of electrical leads, and wherein the wave solder insert comprises a corresponding plurality of peeling members as a grating that extends between opposing edges of the wave solder insert to fully isolate each electrical lead in the row of electrical leads.

9. The system of claim 1, wherein the support panel comprises a thermally insulating material to provide at least some thermal isolation during a wave solder process to components of the circuit board that are not exposed by the aperture.

10. The system of claim 1, wherein the wave solder insert comprises a rigid material to which solder does not readily bond.

11. The system of claim 1, wherein the wave solder insert comprises a titanium insert that is fastened to the support panel.

12. The system of claim 1, wherein the peeling member extends between the two adjacent electrical leads by approximately 50% of a dimension of one of the two adjacent electrical leads.

13. The system of claim 12, wherein the two adjacent electrical leads have circular cross-sections, such that the dimension comprises a diameter and the peeling member extends between the two adjacent electrical leads to approximately a midpoint of the diameter.

14. The system of claim 12, wherein the two adjacent electrical leads have rectangular cross sections, such that the dimension comprises a width defined in a direction perpendicular to a direction of alignment of the two adjacent electrical leads, and wherein the peeling member extends between the two adjacent electrical leads to approximately a midpoint of the width.

15. The system of claim 1, wherein the peeling member extends only partially between the two adjacent electrical leads by an amount equal to less than 25% of a dimension of one of the two adjacent electrical leads.

16. The system of claim 1, wherein the peeling member extends between two edges of the wave solder insert to fully separate the two adjacent electrical leads.

17. A wave solder insert for a wave solder pallet to reduce bridging of through-hole electrical leads during wave soldering, the wave solder insert comprising:
a mounting surface to be attached to a wave solder pallet proximate an aperture in the wave solder pallet;
a plurality of peeling members that
extend from the mounting surface at spacing intervals corresponding to a pitch spacing of electrical leads of a circuit board, and
extend to a length between adjacent electrical leads to at least partially separate the adjacent electrical leads to reduce bridging during a wave solder process.

18. The system of claim 17, wherein each of the plurality of peeling members extends co-planar with respect to the plane of the mounting surface.

19. The system of claim 17, wherein the mounting surface in a first plane and each of the plurality of peeling members extends within a different plane that is substantially parallel to the first plane.

20. The system of claim 17, wherein each of the plurality of peeling members extends between opposing edges of the mounting surface over an aperture in the wave solder pallet to form a grating pattern through which the electrical leads of the circuit board are inserted.

21. The system of claim 17, wherein the peeling members comprise titanium.

22. The system of claim 17, wherein the peeling members comprise tungsten.

23. The system of claim 17, wherein the mounting surface and the peeling members are formed from two different materials.

24. The system of claim 17, wherein the length that each of the plurality of peeling members extends from the mounting surface is configured to provide a maximum amount of separation between adjacent electrical leads without inhibiting a solder wave from soldering each of the electrical leads to the circuit board.

25. The system of claim 17, wherein a width of each of the plurality of peeling members is configured to provide a maximum amount of separation between adjacent electrical leads without inhibiting a solder wave from soldering each electrical lead to the circuit board.

26. The system of claim 17, wherein a thickness of each of the plurality of peeling members is configured to provide a maximum amount of separation between adjacent electrical leads without inhibiting a solder wave from soldering each electrical lead to the circuit board.

* * * * *